(12) United States Patent
Thomas et al.

(10) Patent No.: US 10,473,907 B2
(45) Date of Patent: Nov. 12, 2019

(54) MICROSCOPIC EXAMINATION OF AN OBJECT USING A SEQUENCE OF OPTICAL MICROSCOPY AND PARTICLE BEAM MICROSCOPY

(71) Applicant: Carl Zeiss Microscopy GmbH, Jena (DE)

(72) Inventors: Christian Thomas, Ellwangen (DE); Torsten Sievers, Heldenhelm an der Brenz (DE); Alexander Thesen, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 357 days.

(21) Appl. No.: 15/429,885

(22) Filed: Feb. 10, 2017

(65) Prior Publication Data

US 2017/0160532 A1 Jun. 8, 2017

Related U.S. Application Data

(62) Division of application No. 13/320,208, filed as application No. PCT/EP2010/056228 on May 7, 2010, now Pat. No. 9,581,799.

(30) Foreign Application Priority Data

May 11, 2009 (DE) .......................... 10 2009 020 663

(51) Int. Cl.
*G02B 21/34* (2006.01)
*H01J 37/20* (2006.01)
(Continued)

(52) U.S. Cl.
CPC ............. *G02B 21/34* (2013.01); *G02B 21/26* (2013.01); *G02B 21/33* (2013.01); *H01J 37/20* (2013.01);
(Continued)

(58) Field of Classification Search
CPC ................ H01J 37/20–22; H01J 37/30; G02B 21/00–088; G02B 21/24–248; G02B 21/34
See application file for complete search history.

(56) References Cited

U.S. PATENT DOCUMENTS

| 4,349,242 A | 9/1982 | Ogura |
| 5,321,545 A | 6/1994 | Bisconte |

(Continued)

FOREIGN PATENT DOCUMENTS

| CN | 101315859 A | 12/2008 |
| DE | 39 02 348 A1 | 8/1990 |

(Continued)

OTHER PUBLICATIONS

Application and File History for U.S. Appl. No. 13/320,208, filed Jan. 17, 2012. Inventors: Christian Thomas et al.

*Primary Examiner* — William R Alexander
*Assistant Examiner* — Jeffrey E Madonna
(74) *Attorney, Agent, or Firm* — Patterson Thuente Pedersen, P.A.

(57) ABSTRACT

A slide system for optical microscopy using immersion fluid including a cover glass having a first refractive index and a transparent film having a second refractive index. The second refractive index of the transparent film is matched to the first refractive index of the cover glass. The transparent film protects the cover glass from immersion fluid used for optical microscopy and the transparent film is configured such that the immersion fluid used can be removed by lifting off the transparent film.

6 Claims, 5 Drawing Sheets

(51) Int. Cl.
   *H01J 37/26* (2006.01)
   *G02B 21/26* (2006.01)
   *G02B 21/33* (2006.01)
(52) U.S. Cl.
   CPC ....... *H01J 37/26* (2013.01); *H01J 2237/2007* (2013.01)

(56) References Cited

U.S. PATENT DOCUMENTS

| | | |
|---|---|---|
| 5,812,312 A | 9/1998 | Lorincz |
| 5,905,266 A | 5/1999 | Larduinat et al. |
| 6,683,316 B2 | 1/2004 | Schamber et al. |
| 7,675,034 B2 | 3/2010 | Faber |
| 8,530,856 B2 | 9/2013 | Spruck et al. |
| 2003/0025087 A1 | 2/2003 | Schamber et al. |
| 2003/0027342 A1 | 2/2003 | Sheridan et al. |
| 2004/0091393 A1 | 5/2004 | Richardson |
| 2004/0145805 A1 | 7/2004 | Qiu |
| 2008/0250881 A1 | 10/2008 | Dona |
| 2008/0296499 A1 | 12/2008 | Faber |
| 2008/0308731 A1 | 12/2008 | Nishiyama et al. |
| 2009/0039285 A1 | 2/2009 | Cooper |
| 2009/0242763 A1 | 10/2009 | Buijsse |
| 2010/0021037 A1 | 1/2010 | Zahniser et al. |
| 2011/0133083 A1 | 6/2011 | Bierhoff et al. |
| 2012/0126115 A1 | 5/2012 | Heise et al. |
| 2013/0077160 A1 | 3/2013 | Heise et al. |
| 2014/0268321 A1 | 9/2014 | Damiano, Jr. et al. |

FOREIGN PATENT DOCUMENTS

| | | |
|---|---|---|
| EP | 0 849 765 A2 | 6/1998 |
| EP | 1 998 206 A2 | 12/2008 |
| JP | 7-29535 | 1/1995 |
| JP | 10-214583 | 8/1998 |
| JP | 2003-262800 | 9/2003 |
| JP | 2006-170770 | 6/2006 |
| WO | WO 99/53357 | 10/1999 |
| WO | WO 02/25691 A1 | 3/2002 |
| WO | WO 2007/143734 A2 | 12/2007 |

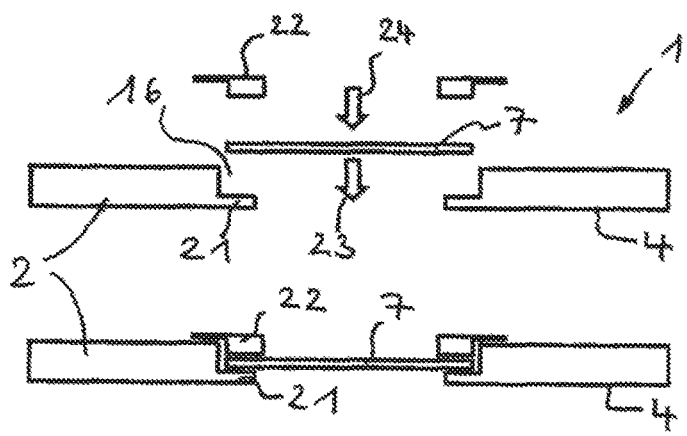
Fig. 5a
Fig. 5b
Fig. 5c
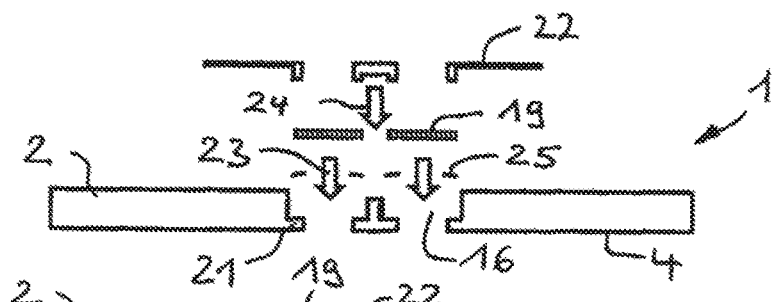
Fig. 6a
Fig. 6b
Fig. 6c

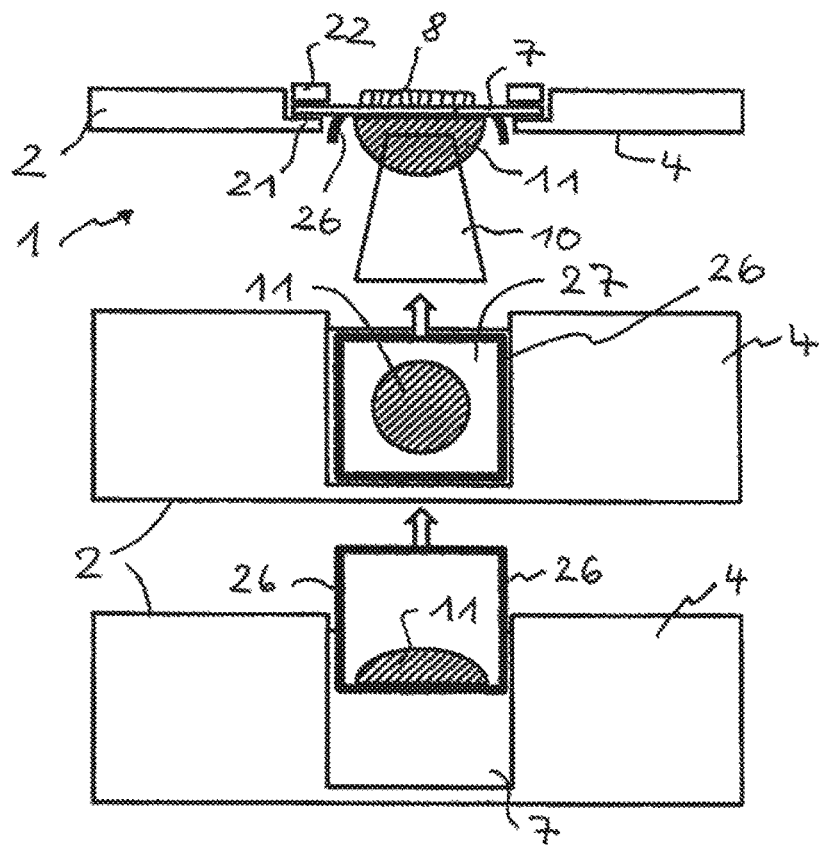
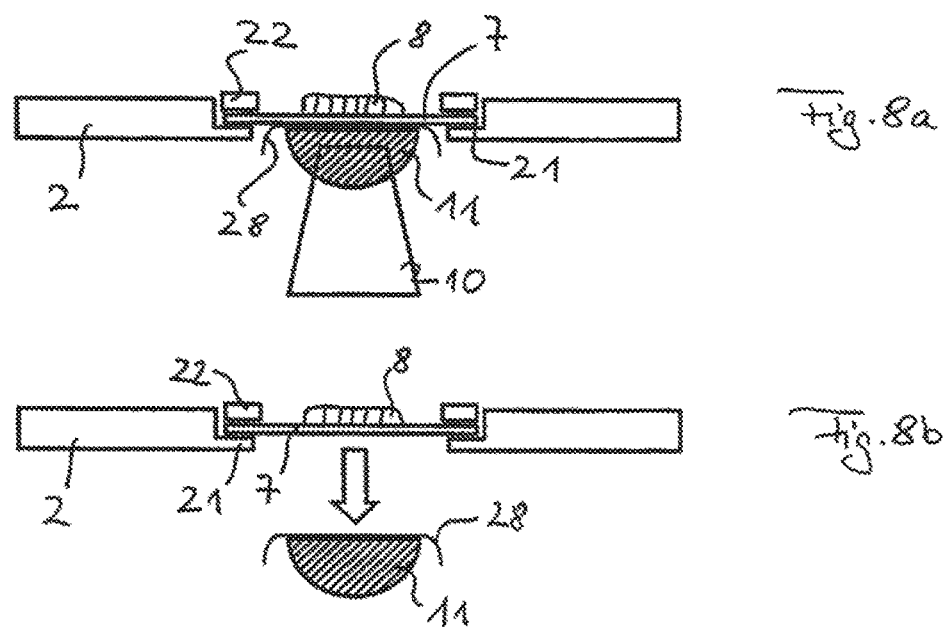

MICROSCOPIC EXAMINATION OF AN OBJECT USING A SEQUENCE OF OPTICAL MICROSCOPY AND PARTICLE BEAM MICROSCOPY

CROSS-REFERENCE TO RELATED APPLICATIONS

The present application is a divisional of U.S. application Ser. No. 13/320,208 entitled "Microscopic Examination of an Object Using a Sequence of Optical Microscopy and Particle Beam Microscopy," filed Jan. 17, 2012, which is a National Phase entry of PCT Application No. PCT/EP2010/056228, filed May 7, 2010, which claims priority from German Application Number 102009020663.9, filed May 11, 2009, the disclosures of which are hereby incorporated by reference herein in their entirety.

BACKGROUND

The invention relates to microscopic examination of an object using a combination of optical microscopy and particle beam microscopy.

For biological and material-science samples in particular, an examination using both optical microscopy, e.g. light microscopy, and particle beam microscopy, e.g. electron microscopy, is often desirable. In the state of the art complex microscopes which can carry out both microscopy methods are used for this. One such microscope is known for example from EP 0849765 A2 or U.S. Pat. No. 6,683,316 B2. Such combination microscopes are complex in particular because the whole of the optical microscope has to be integrated into the vacuum chamber which is required for the particle beam microscopy, and a sample table which moves the sample between both microscopes under a vacuum has to be provided. This results in a relatively large vacuum volume and in addition significant outlay when manufacturing the optical microscope, which then has to be suitable for use under a vacuum. A further disadvantage is that optical imaging with immersion cannot be carried out under a vacuum. If the object is not arranged under a vacuum during the particle beam microscopy, as e.g. in the combination microscope according to US 20080308731 A1, the imaging quality suffers, as the electrons are scattered on a membrane as well as in air.

An alternative to the use of such combination microscopes is the sequential use of single devices. Various designs of holder are used for this in the state of the art. For optical microscopy, glass slides measuring a few centimeters, with cover glasses placed over the sample are customarily used. In electron microscopy, grids a few millimeters in size, or metal sample plates are customary. In order to pass an object to be microexamined, for example a biological sample, from optical microscopy to particle beam microscopy, the sample has to be transferred from one holding system to the other. This involves some disadvantages. Firstly the transfer is time-consuming and carries the risk of damaging or destroying the sample. Secondly providing a location reference in both microscopy methods is difficult, as the position of an area examined e.g. with optical microscopy first has to be found again for particle beam microscopy. Nor does the use of markers in the object or on the biological sample provide further help here, as the structure of the sample changes as a rule during the transfer, e.g. as a result of distortion. A time-consuming and laborious recovery of the object position already microexamined with the other method is thus unavoidable.

SUMMARY

In an embodiment of the invention, a slide system for microscopic examination of an object uses a sequence of optical microscopy and particle beam microscopy, wherein the system comprises: an electrically conductive holder, wherein at least one window is formed in the holder and wherein the holder preferably has the dimensions of a standard glass slide for optical microscopy, a slide element, which is formed to carry the object for microscopy and which is formed to be laid over the window, and a fastening device which is formed to fix the slide element over the window.

By a window is also meant in this description a cut-out which is not completely surrounded by the material of the holder, and e.g. lies at the edge of the slide.

A feature and advantage of embodiments of the invention is that it facilitates microscopic examination of an object using a sequence of optical microscopy and particle beam microscopy without having to incur the outlay required with a combination microscope.

Within the scope of the invention a method for the microscopy of an object is also provided wherein the object is examined using an optical microscope and, before or afterwards, using a particle beam microscope, wherein furthermore a slide system of the type defined is used. The object is thus placed on the slide element and positioned over the window of the holder. The holder is then inserted successively into the two microscopes used, i.e. the optical microscope and the particle beam microscope, with the result that the object is examined successively with both microscopes.

The fact that the object is located on the same holder in both microscopes is advantageous particularly if at the same time microscopes are used which have a mechanism for moving the holder when it is inserted into the microscope. In a development of the method it is then possible to use a slide system the holder of which has the mentioned alignment mark(s). An object area is defined, and during the microscopy with the microscope used first, e.g. the optical microscope, a relative position of object area and alignment mark is determined in which, by actuating the mechanism, both the object area and also the alignment mark(s) are imaged using the microscope used first. As the relative position of object area and alignment mark(s) is thus known, the alignment mark is imaged in the microscope used subsequently, e.g. the particle beam microscope, and the object area is approached by actuating the mechanism starting from the alignment mark and by using the already known relative position.

The method can also be refined such that in both microscopes the position of the alignment mark relative to the respective microscope is determined by imaging the alignment mark(s) using the microscope. The positions of object areas are then stored as relations to the alignment mark(s).

The method makes it possible to easily bring a specific object area into a desired position in the respective microscope, since a calibration of the object area relative to the position with respect to the holder is achieved by the alignment mark(s).

The mechanism for moving the holder, for example a sample table, can be calibrated with respect to the position of the holder via the alignment mark(s) both in the optical microscope and also in the particle beam microscope. For this, the alignment mark(s) is (are) approached, and the corresponding position of the mechanism, e.g. of the sample table, is read. This can be carried out both by the user and also automatically using suitable control means. The alignment mark(s) also define a position indication for the holder; when three alignment marks are used a coordinates system can be established. Thus the position of the sample holder for each object area of interest can easily be stored as relation(s) to the alignment mark(s). After a transfer of the holder into the second microscope, e.g. the particle beam microscope, calibration is first carried out again on basis of the alignment mark(s), by imaging the mark(s) upon actuating the mechanism, e.g. the sample holder, and coupling this with the corresponding position of the mechanism, e.g. of the sample table. In this way already-stored object areas can be approached simply by actuating the mechanism. The user does not need to concern himself with finding previously defined object areas anew in the second microscope.

By means of the slide system according to the invention, the object can be examined successively with separate microscopes, without a transfer or relocation of the object being necessary. The invention therefore proves a correlative slide system which makes it possible to place the sample on a holder and to successively examine it on the same holder both with an optical microscope and a particle beam microscope.

By optical microscopy is meant within the meaning of this description any microscopy method which uses for imaging radiation obeying the laws of optics, in particular in the visible range, i.e. light. Particle beam microscopy within the meaning of this description is when an imaging takes place by means of a beam of charged particles, for example in the form of electron beam microscopy. Where light microscopy or electron beam microscopy are mentioned in this description, these are to be understood purely as exemplifying optical microscopy or particle beam microscopy.

The holder of the slide system according to the invention is suitable for both optical microscopy and also for particle beam microscopy. The latter requires the holder to be electrically conductive while being magnetizable only within tolerable predetermined limits if at all. The sample, i.e. the object for microexamination, is held or carried on the slide element. The slide element can then be placed over the window formed in the holder, and the fastening device then fixes the slide element over the window. The object is secured to the holder by means of this fixing and can be examined using both optical microscopy and also particle beam microscopy, without requiring object relocation to other carriers. Thus the same advantages are achieved as a combination microscope has, without having to incur the outlay associated with a combination microscope which can carry out both optical microscopy and also particle beam microscopy. The imaging quality is also very much better both in the optical and also in the particle beam microscope.

The sample, or the object, which is located on the slide element secured to the holder, is optically accessible both through the window from above and also from below. This allows not only reflected light microscopy, but also transmitted light microscopy, if the slide element is suitably transparent. This applies analogously to particle beam microscopy.

In order to be able to achieve as small as possible an operating distance between the beam path of the optical microscope and the object for optical microscopy, it is advantageous to configure the system such that the sample is located as close as possible to one side, for example the bottom of the holder. This can easily be achieved by the holder having a recess and the window being formed in the recess. Furthermore, the slide element can be inserted into the recess such that, with a slide element placed over the window, the sample is located closer to one side of the holder, for example the bottom, than to the other. As an alternative to a holder with a recess, the fastening device can also be arranged on one side, e.g. the bottom, of the holder, with the result that the slide element is placed against the corresponding side of the holder and over the window.

The sample is placed on the slide system described here. It is then examined with an optical microscope and a particle beam microscope, wherein the sequence can be chosen dependent on the application. The holder is inserted into both microscopes. Specific object areas of interest are usually examined in an object. In order after insertion or introduction into the corresponding microscope to know the position of the object area of interest as precisely as possible, or to be able to determine it clearly, it is advantageous to provide the holder with at least one alignment mark which can be detected using both optical microscopy and particle beam microscopy. In addition or optionally the holder can have mechanical adjustment means which are formed to adjust the holder in an optical microscope and/or a particle beam microscope. These mechanical alignment means can for example be based on a key/lock principle, designed in the form of suitable stops, guides, or similar. They result in the holder lying in a predetermined position relative to the respective microscope, which allows a referencing of object areas within the accuracy of this alignment.

The optional or alternative variant with the at least one alignment mark delivers increased accuracy. It is particularly high if at least three alignment marks are provided establishing a coordinate system. Each alignment mark can optionally be designed as a double mark, adapted for the two different microscopy magnifications.

The fixing of the slide element over the window contributes to the desired immobility of the object in both microscopes. This fixing can for example be carried out by means of a clamping device. It is therefore preferred that the fastening device has at least one clamping device connected with the holder alongside the window or anchored there for fixing the slide element over the window. This clamping device can for example comprise a clamping ring and/or spring washers.

The slide element carries the object or sample on one hand and is secured to the holder on the other hand. It can be suitably designed depending on the microscope or object. In particular it is possible to form the slide element as a conductive grid. The fastening device is then formed such that it secures, e.g. clamps the grid over the window securely.

An alternative realization for the slide element is a cover glass, such as is known from light microscopy. Such a cover glass can be combined with a fastening device which has rails extending alongside the window of the holder, into which the cover glass can be inserted, with the result that in this way it can be placed over the window and at the same time is secured to the holder. In addition the rails optionally have suitable fixing or clamping means for fixing the cover glass in the rails.

In optical microscopy an immersion fluid is often used to increase resolution. It can for example contain oil or water. In particle beam microscopy such a fluid generally contaminates the required vacuum. It must therefore be removed if one wishes to carry out optical microscopy before the particle beam microscopy. This can be done particularly simply if the system comprises a transparent film the optical refractive index of which is matched to that of the cover glass, which film protects the cover glass from the immersion fluid used, with the result that the immersion fluid used can be removed by lifting the film. Such a film is also possible and advantageous, independently of the abovementioned combination microscopy. By a refractive index matched to that of the cover glass is meant in particular a refractive index, which is as far as possible equal to that of the cover glass (e.g. with max. 10% deviation) or within predetermined tolerances (e.g. 0.1). Because conventional cover glasses have a refractive index of 1.5255, a film the refractive index of which lies between 1.4 and 1.6 is particularly advantageous.

Electrostatic charges, adhesion (adhesion by means of loose molecular bonds, e.g. due to van der Waals forces) or an adhesive layer in particular come into consideration for securing the film to the cover glass. In order that the latter does not interfere with the imaging by the optical microscope, the thickness of the adhesive layer preferably amounts to only a fraction (e.g. 1/10 or less) of the wavelength of the radiation used in optical microscopy, or the refractive index of the adhesive layer is matched or approximated to that of the cover glass and of the film within the named tolerances. In order not to produce residues of the adhesive layer on the cover glass, the adhesive layer is preferably formed such that when the film is removed the adhesive layer remains adhering to the film alone, and not the cover glass.

For easier lifting, it is possible to provide the film with a stiffening ring which runs around the edge of the film. The ring can ensure a pot-like structure of the film with stiffening ring. Firstly, the immersion oil can thereby be sure to be contained on the film (e.g. in this pot-like structure), secondly, the lifting of the film is made easier.

Lifting off the film is also easy if the film is larger than the window, as it then projects over the window frame and can easily be taken off.

As an alternative to a film a ring can also be used which has a rubber lip on an underside, wherein the inside of the ring is smaller than the cover glass, with the result that the ring can be placed on the cover glass and immersion fluid applied with the rubber lip to the cover glass for optical microscopy can be removed from the cover glass. For such a design of the system, the holder is formed such that the cover glass is not bounded by the holder at one edge such as to obstruct the removal of the rubber lip. Rather, when a cover glass is secured in the holder, the holder makes it possible to pull off the rubber ring or the rubber lip over an edge of the cover glass.

To secure the holder in the microscope, in particular in the particle beam microscope an adapter is advantageous which has a fitting device for securing the adapter to a device housing the particle beam microscope and at which a bearing surface is formed with a retaining device for fixing the holder on the bearing surface. This adapter preferably has, under the bearing surface and above the fitting device, a recess for introducing a particle beam detector, as a measurement is then possible in transmission mode.

It is understood that the features mentioned above and those yet to be explained below can be used, not only in the stated combinations, but also in other combinations or alone, without departing from the scope of the present invention.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Subject matter hereof may be more completely understood in consideration of the following detailed description of various embodiments in connection with the accompanying figures, in which:

FIGS. 6a-c are sectional views (FIGS. 6a and b) and a top view (FIG. 6c) of a slide system in accord with embodiments of the invention, FIGS. 7a-c are sectional views (FIG. 7a) and top views (FIGS. 7b and c) of the slide system in FIG. 5 complemented by including a component for removing immersion fluid from the slide in accord with embodiments of the invention, FIGS. 8a and 8b are sectional views of an alternative complementation of the slide in FIG. 5, also for removing immersion fluid, FIG. 9 provides top views of two slide designs illustrating marks which are evaluated in microscopy in accord with embodiments of the invention.

Figure 1:
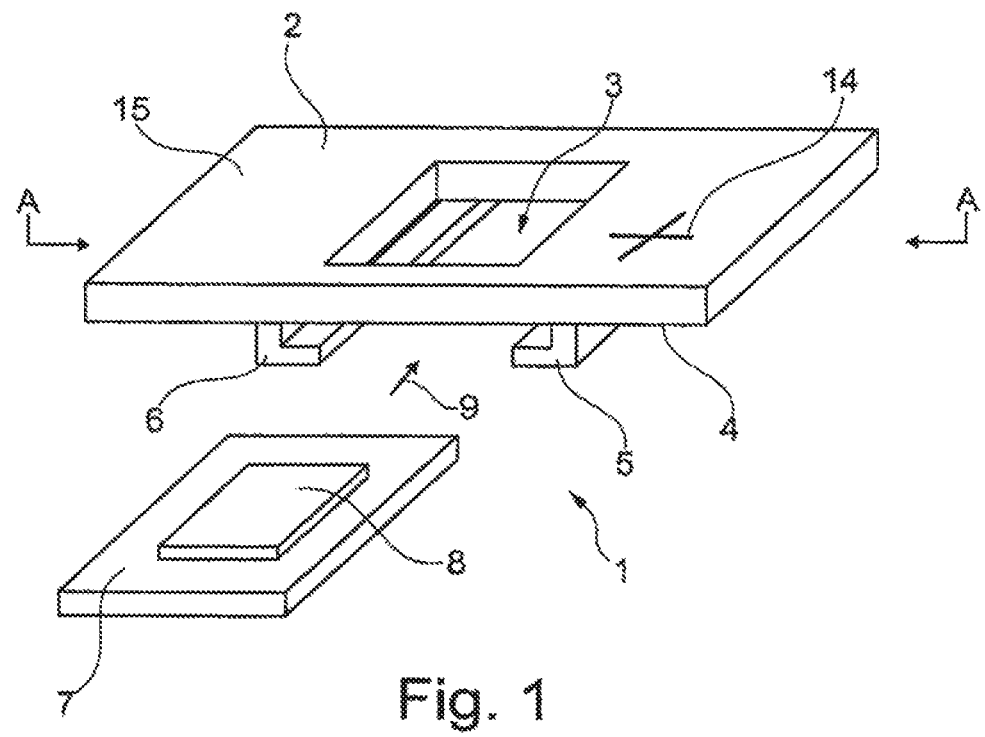
FIG. 1 is is a perspective view of a slide system in accord with embodiments of the invention.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF THE DRAWINGS

Reverting to the figures, a slide system is described by means of which an object can be examined using a combination of optical microscopy and particle beam microscopy. In the following description, light microscopy, and in particular also fluorescence microscopy, are described as an example of optical microscopy. This is, of course not to be taken as a limitation, but as serving merely to improve understanding. Equally, electron beam microscopy is described as an example of particle beam microscopy, and this should likewise not to be considered as a limitation for the slide system described. If terms such as "bottom", "top", "left" and "right" are used in the description these relate, unless otherwise indicated, to the orientation of the components shown in the figures.

FIG. 1 shows a slide system 1 with which an object, a biological sample in the example described, can be examined using a combination of light microscopy and electron beam microscopy. The system 1 comprises a metal holder 2, which has the external dimensions of a standard glass slide. It is thus for example 75.5 mm long and 25.5 mm wide. Such a size allows a particularly easy use of the holder 2 in a conventional light microscope. Other sizes are of course optionally possible for the holder 2 and may be advantageous depending on application.

In a central area in which light microscopy would customarily be used with a glass slide, the holder 2 has a window 3 which is formed as a complete opening through the panel-shaped holder 2. Formed on the bottom of the holder 2, alongside the window 3, are rails 5 and 6, into which a cover glass 7 on which a sample 8 for microexamination is located can be slided in. The insertion takes place in direction of a diagrammatically represented arrow 9. Stops which limit the insertion of the cover glass 7 are optionally provided at the rails 5 and 6 (and cannot be seen in FIG. 1). In addition clamping and fixing mechanisms which fix the inserted cover glass 7 can also be provided.

Figure 2:
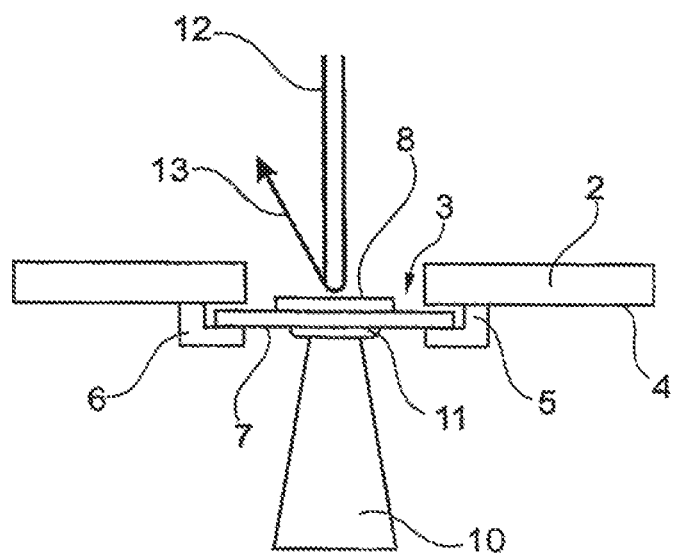
FIG. 2 is a sectional view along the line A-A in FIG. 1.

FIG. 2 shows a sectional representation through the system 1 with cover glass 7 inserted, wherein the section is along the line A-A. Elements, features and components of the system 1 which have already been described with reference to FIG. 1, have the same reference numerals in FIG. 2 and are not explained again here (nor in the other figures).

The design is such that the holder 2 fits into any common light microscope and can also be introduced without difficulty into an electron microscope because of being made of metal and having the window. The cover glass 4, mounted on the bottom, on which the sample 8 is located, can now be optically scanned with a light microscope beam path 10. An immersion oil 11 can be applied to the cover glass 7 on the bottom of the cover glass 7 which bottom is opposite the sample 8, if this is necessary for light microscopy. Naturally, in principle any other (e.g. aqueous) immersion agent can be used instead of oil for the embodiments described here.

The location of the cover glass 7 at the bottom 4 of the holder 2 further allows a microscope objective to be brought close to the cover glass 7 without difficulty, with the result that the working distance customary for inverted light microscopy for example of approximately 200 μm can be realized without difficulty. The rails 5 and 6 are suitably formed such that the fine blades of the rails which blades hold the cover glass 7 cannot come into contact with the microscope objective.

The window 3 makes the sample also optically accessible from two sides, with the result that a transmitted-light microscopy can be easily carried out equally.

The sample is further accessible from the top for an electron beam 12, with the result that it can be examined in the same holder 2 not only by light microscopy, but also by electron beam microscopy. Backscattered and/or secondary electrons 13 radiated from the sample then give an electron microscopic image of the sample 8.

For electron-microscope examinations in high vacuum, the sample 8 can optionally also furthermore be coated to be electrically conductive before electron microscopic examination.

Essential for the invention is that during all procedures the sample 8 can remain on the cover glass 7 inserted into the holder 2. The allocation of the sample 8 to the holder 2 is thus fixed in all preparation and microscopy steps. The holder 2 therefore has suitable marking means, for example a mark 14 on the top 15 of the holder, wherein the mark 14 is visible for electron beam microscopy. Equally, there is located on the bottom 4 of the holder an allocated additional mark which can be detected by light microscopy. Naturally, more than one mark can be used, too. Advantageously, the mark(s) is (are) designed such that they define a coordinates system with the help of which the sample areas to be examined can be correlated between light microscopy and electron beam microscopy. Because of these correlation possibilities, the slide system 1 allows a correlated microscopy of the sample 8. Alternatively, the mark 14 can be applied to a transparent medium which is introduced into a further or the same window, with the result that it can be scanned for light microscopy from both sides.

For such electron-microscope examinations in high vacuum, it is further advantageous if the cover glass is coated with an electrically conductive material or is provided to be electrically conductive. By using light microscopy, either an optically transparent electrically conductive coating can be used or the electrically conductive coating is/will be applied only to the side of the cover glass 7 from which the electron beam 12 strikes the sample 8. In the representation in FIGS. 1 and 2, this would be the top of the cover glass 7.

Naturally, variations on the slide system 1 in FIGS. 1 and 2 are possible, thus for example not just one cover glass 7 but also several cover glasses can be used in parallel in a holder. Securing means other than the rails 5 and 6 are also possible; examples of this will be explained below.

Figure 3:
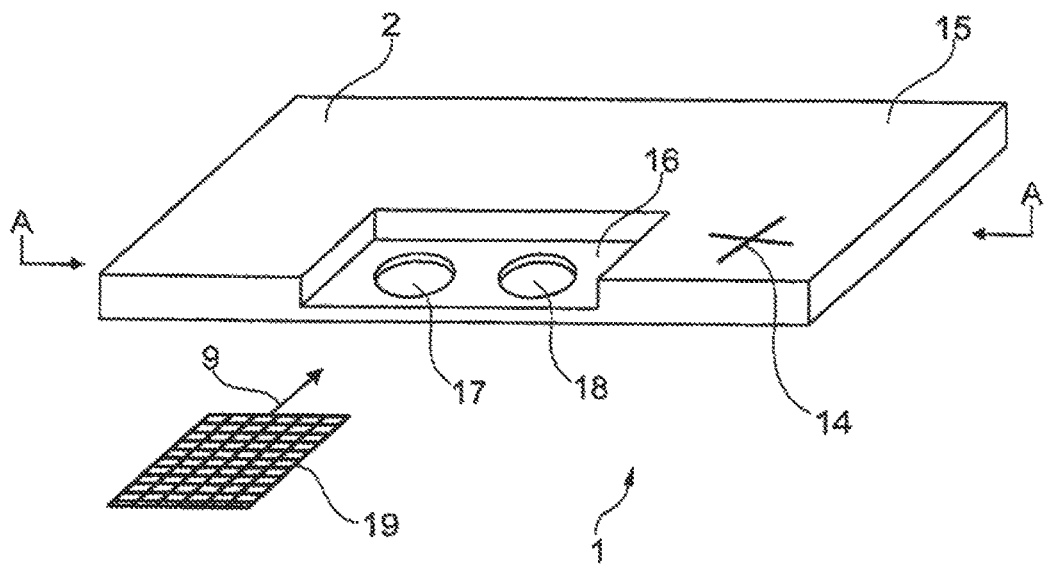
FIG. 3 is a perspective view of a slide system in accord with embodiments of the invention.

FIG. 3 shows a further design of the slide system 1. The holder 2 is again electrically conductive, for example of aluminium or another conductive metal, and also has, as in the design in FIGS. 1 and 2, the dimensions of a standard slide for light microscopy. Formed on the top of the holder 2 is a recess 16 in which lie windows 17 and 18 which are formed as continuous holes through the holder 2 in the recess 16. Grids 19 can be inserted into these recesses and over the windows 17, 18 and then inserted into the recess 16 along the direction of the arrow 9. The grids 19 can be clamped securely over the windows 17 or 18 by means of a clamping device (not shown in the figures) and are formed to house a sample 8 on their top.

Figure 4:
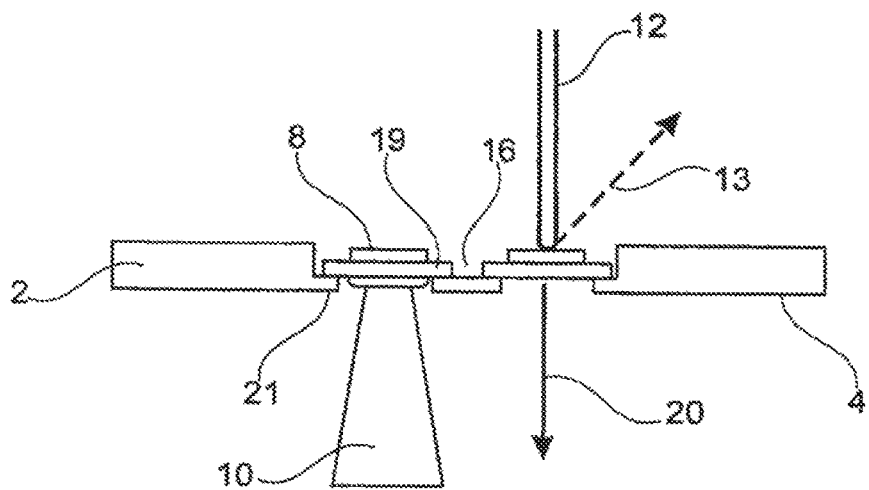
FIG. 4 is a sectional view along the line A-A in FIG. 3, FIGS. 5a-c are sectional views (FIGS. 5a and b) and a top view (FIG. 5c) of a slide system in accord with embodiments of the invention.

FIG. 4 shows a sectional representation along the line A-A of the slide system 1 in FIG. 3, i.e. a representation the view of which corresponds to that in FIG. 2.

As can be seen, the sample 8 on the grid 19 is optically accessible both from above and from below, can thus be microscopically examined both in reflected light and in transmitted light mode with a light microscope beam path 10 which operates here without immersion oil. As also in the design in FIG. 1, the grids 19 are attached as close as possible to the bottom 4 of the holder in order to make possible an approach as close as to the working distance of a customary inverse light microscope. For this, the lands 21 which still remain, after generation of the recess 16, between the top of the recess 16 and the bottom 4 of the holder 2, are preferably provided with a land thickness of less than 200 μm.

For electron beam microscopy by means of the electron beam 12, the sample 8 is now equally accessible from both sides. Thus an electron beam microscopy with detection of secondary and/or backscatter electrons 13 is possible, as is also a transmissive electron beam microscopy with detection of transmitted electrons 20. The particle beam comes e.g. from above, and detection can be carried out above and below the sample.

The structure of the holder 2 further allows the electron beam to also be directed onto the sample 8 from the side in order to carry out three-dimensional examinations.

The grids 19 are preferably designed to be conductive; copper, gold, nickel etc. are possible materials.

Essential for the mode of operation of the slide system is that the sample is fixed immobile on the slide element (for example the cover glass 7 or the grid 19) in relation to the holder 2 with the result that the sample 8 does not move relative to the holder 2.

The design with rails depicted in this regard with the help of FIGS. 1 and 2 is naturally not the only possibility for fixing the slide element over the window 3 and relative to the holder 2.

The cover glass 7 is an example of a slide element that is formed to carry the object for microexamination and that can be placed over the window 3.

The grid 19 of the design in FIG. 3 is thus an alternative to the cover glass 7 in respect of the realization of the slide element.

FIGS. 5a-c show a variation in this regard. Here, the cover glass 7 is inserted into a recess formed on the holder 2, which recess to this extent corresponds to the recess 16 of the design in FIG. 3 and therefore also has the same reference numerals in FIG. 5a. FIGS. 5a and 5b show sectional representations of a slide system 1 that also operates with a cover glass 7 as slide element. FIG. 5a represents the assembly procedure. The assembled state is shown as sectional representation and top view in FIGS. 5b and 5c, respectively.

The cover glass 7 is inserted into the recess 16 along the direction of the arrow 23. A clamping ring 22 is inserted above the cover glass 7 in the direction of an arrow 24, which clamps the cover glass 7 between a land formed on the bottom 4 of the holder 2, which land corresponds in terms of function to the land 21 in FIG. 4 and therefore also has this reference numeral in FIGS. 5a and b, and the clamping ring 22. The clamping ring 22 is screwed to the holder 2, as shown in the top view in FIG. 5c, for example by means of screws that engage in the holder 2.

FIGS. 6a-6c show a design which corresponds to that of FIGS. 5a-c as regards the securing of the slide element. However, the system 1 in FIGS. 6a-c is formed for grids 19 as slide elements. Design and function correspond essentially to the design in FIGS. 5a-c. However, as the grids 19 are less rigid than the cover glass 7, spring washers 25 are inserted, which washers also clamp in the grids 19 between the clamping ring 22 and the land 21 and thus ensure a better securing before the grids 19 are inserted into the recess 16.

In light microscopy, immersion agents, for example immersion oils, are used to increase resolution. Such an immersion oil bears for example in FIG. 2 the reference numeral 11. As electron beam microscopy is usually carried out in a vacuum, immersion oil must be removed beforehand if a sample is to be examined first with light microscopy and then with electron beam microscopy. FIGS. 7a to 7c show a further refinement of the system in this regard which makes it easier to remove the immersion oil 11 or other liquid immersion agent. For this, the immersion oil 11 is applied to the cover glass 7 which carries the sample 8 on top, but within a rubber ring 26, which cover glass 7 is located at the bottom 4 of the holder 2 of the slide system 1. As the top view in FIG. 7b, which shows the holder 2 from the bottom 4, reveals the immersion oil 11 is applied within the opening 27 of the rubber ring 26. In this design, the holder 2 is further designed such that it is possible to pull off the rubber ring 26 sideways from the cover glass 7. In the design in FIG. 1, this can be effected for example by moving the rubber ring 26 parallel to the rails 5, 6. In the design with clamping ring 22, as shown in FIGS. 7a to c, the holder 2 does not have a land 21 running around the bottom 4, but the land 21 runs round in a U-shape, with the result that the rubber ring 26 can be pulled off the cover glass 7 to one side. As a result, the cover glass can easily be freed of immersion fluid by pulling off the rubber ring over the cover glass 7 before inserting the holder 2 into the electron microscope. A contamination of the vacuum of the electron microscope is thus easily avoided.

FIGS. 8a and 8b show an alternative design for preventing contamination of an electron microscope. In this case, a transparent film 28 is used which is laid between the immersion oil 11 and the cover glass 7. The refractive index of plastic films made of organic polymers is generally between 1.3 and 1.7. E.g. polyethylene terephthalate (PET) has a refractive index of 1.5750, polymethyl methacrylate (PMMA) of 1.4914 (for Plexiglas 7N), polystyrene (PS) of 1.5900 (for PS 168 N), polycarbonate (PC) of 1.5660 (for PC APEC 2097), polymethyl methacrylimide (PMMI) of 1.5340 (for Pleximid 8817 F), and cycloolefinic copolymers (COC) have a refractive index of 1.5333 (for Topas 5013). In addition, the refractive index of polymer films can be even more precisely matched by adding inorganic nanoparticles.

The film 28 has a refractive index which is matched to that of the cover glass 7 by making it as equal as possible to that of the cover glass 7. It is applied before light-microscope examination opposite the sample 8 at the bottom of the cover glass 7 such that no air gap or blisters form, interfering optical properties such as reflection are avoided, and the film 28 bonds to the cover glass 7. This can be effected e.g. by electrostatic charging or adhesion or by means of a thin adhesive layer the thickness of which is much smaller than the wavelength of the light used or the refractive index of which is matched to cover glass 7 and film 28 and which, when the film 28 is removed, continues to adhere exclusively to the latter.

In areas of the cover glass 7 where no light microscopy examination shall take place, the film 28 does not necessarily have to adhere closely to the cover glass 7, but can ideally also be lifted, in order thus to prevent spread of the immersion oil 11 which is applied for the light microscopy examination. Before the introduction into the electron microscope the film 28 is pulled off together with the immersion oil 11, and there is no risk of contamination of the vacuum system of the electron microscope from the holder 2 with the cover glass 7.

The film 28 can of course also be provided with a stiffening ring which ensures a pot-like structure of the film 28 with stiffening ring, with the result that the immersion oil 11 is securely confined in this pot-like structure. This facilitates the lifting of the film 28 with the immersion oil 11. However, the stiffening structure should be formed such that it does not adversely affect the working distance between light microscope beam path 11, i.e. a lens of the light microscope, and the bottom of the cover glass 7.

Figure 9:
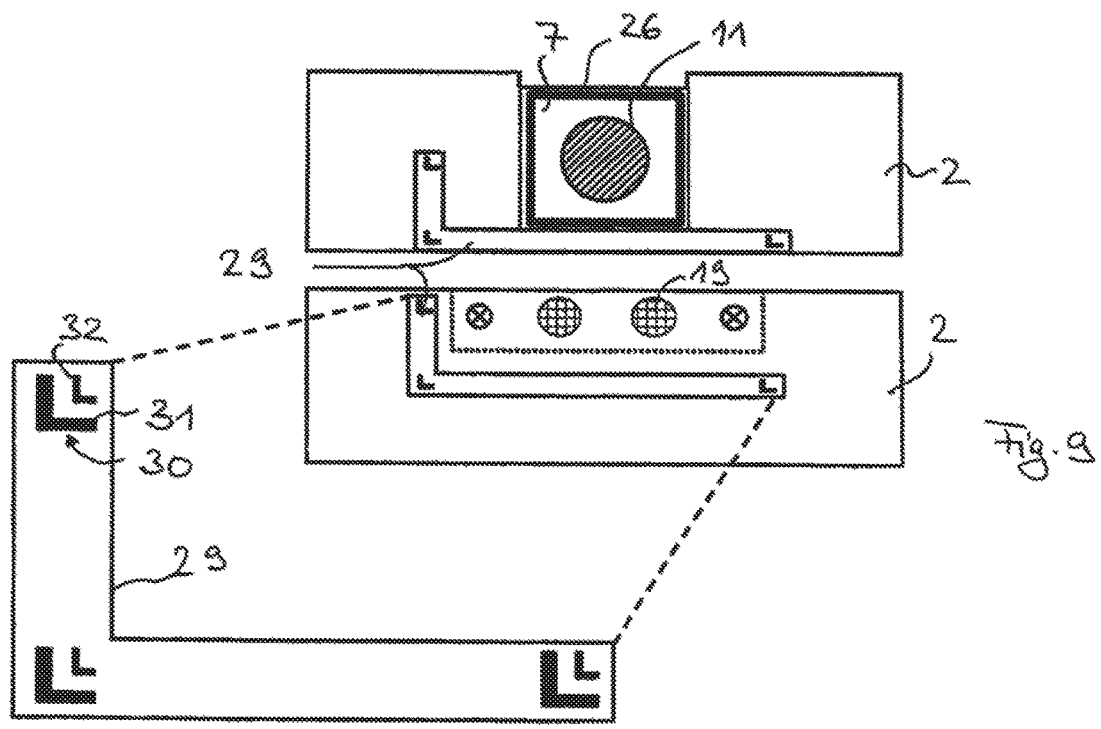

An advantageous effect of correlative microscopy using a combination of light microscopy and electron beam microscopy is that the position of the sample 8 is fixed relative to the holder 2 in all states of microscopy. As already mentioned, a mark can be provided on the holder 2 for referencing to this position. An example of this design is shown in FIG. 9, which shows top views of the holder 2 according to FIGS. 5a-c and of the holder according to FIGS. 7a-c. The latter is shown above the former. In order to define a coordinates system independent of the microscope, this embodiment provides for an array of marks 29 on the holder 2 which array defines a coordinate system for the holder 2. The array of marks consists of a total of three double marks 30, which for example, as shown in FIG. 9, lie in an L-shape with respect to each other. This array is shown in FIG. 9 in a magnified partial view. The L-shaped formation of the double marks 30 allows a clear establishment of the coordinate system. Thus the position and orientation of the holder 2 can easily be determined from the distance between the double marks 30. The double marks 30 are of course designed such that they are detectable both with light microscopy and with electron beam microscopy, e.g. as a chromium mark on transparent and conductively coated quartz glass.

Each double mark 30 consists of two single marks 31, 32 of different size, which are thus suitable for two different magnifications.

However, this is not necessarily the case, as alternatively only single marks can be used instead of the double marks 30.

Essential for the marks is that they can be detected with both microscopy methods, or that marks are provided, which are in known alignment to each other, and perceptible in each case for at least one of the microscopy methods.

The position of the holder 2 can be calibrated both in light microscopy and also in electron beam microscopy via the array of marks 29. For this, the three marks in the array of marks 29 are successively approached and the corresponding position of a translation stage of the microscope read. This can be carried out both manually by the user and automatically using image-processing algorithms. Once the three marks in the array of marks are thus found with respect to their coordinates, the coordinates system of the holder 2 is defined. In this way, the position of the sample table for each sample area of interest can be easily stored. The transfer of the holder 2 into the other microscope is followed first by another calibration of the position of the array of marks 29. The previously stored sample areas can then be accessed automatically and without time-consuming searching.

Figure 10:
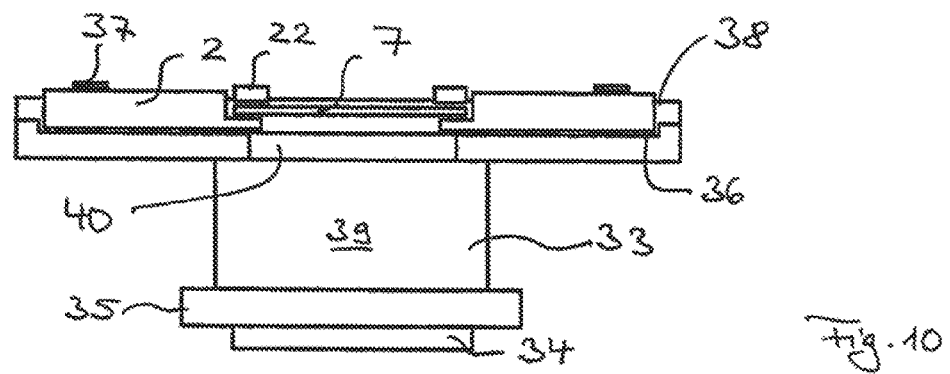
FIGS. 10 and 11 are schematic views of an adapter for placing any of the slides according to FIGS. 1 to 9 in an electron beam microscope in accord with embodiments of the invention.
Figure 11:
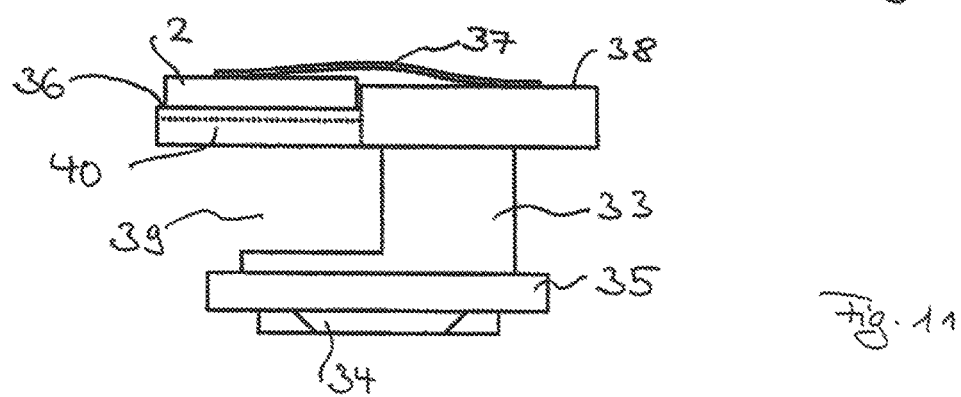

An adapter 33, shown in FIGS. 10 and 11, is preferably provided for securing the holder 2 in an electron microscope.

This adapter allows to receive a sample, which is placed on the holder 2 and was examined beforehand by light microscopy, directly into an electron microscope and analyze it further there. For this, the adapter 33 has a dovetail 34 which is formed on a base 35 for securing to a reception device of the electron beam microscope. Of course, depending on the reception device of the electron beam microscope, a suitable fitting device is provided at the base 35 of the adapter 33; here the dovetail 34 is shown only by way of one example.

On the top of the adapter 33 is a support 38 for receiving the holder 2. The holder is fixed onto the support 38 with clamping springs 37 or other suitable retaining devices. In a preferred design the adapter 33 at the same time also effects a prealignment of the holder 2, by having means which cooperate with corresponding counterparts on the holder 2 according to the lock/key principle. This lock/key principle preferably achieves a prealigned position of the holder 2 fitting accurate to within 50 µm. For example the adapter 33, as shown in FIGS. 10 and 11, can have in the support 35 a recess 36 in which guide edges correspondingly provided on the holder 2 engage. The holder 2 can be placed in a prealigned position on the adapter 33 and mechanically fixed there.

In order to allow a transmission measurement in electron beam microscopy, the adapter 33 comprises a recess 39 between the base 35 (or the dovetail 34) and the support 38 and comprises an opening 40 in the support 38 into which opening a transmission electron detector of the electron microscope can be introduced. The dimensions of the adapter 33 are such that a sample which is located on the inserted holder 2 which is secured to the adapter 33 is located at the predetermined working distance from the pole shoe of the electron microscope, for example at a distance of 3 mm.

For a proper mode of operation, the adapter 33 is furthermore electrically conductive, in order to avoid electrostatic charging of the adapter or of the slide 10 or the sample and in order to ground the sample.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

The invention claimed is:
1. A method for microscopy of an object, comprising
using a slide system comprising a slide and a cover glass having a first refractive index, a transparent film having a second refractive index, the second refractive index of the transparent film being matched to the first refractive index of the cover glass; and
protecting the cover glass from immersion fluid used for optical microscopy by application of the transparent film wherein the immersion fluid is removable by lifting off the transparent film;

imaging the object with one of an optical microscope and a particle beam microscope; and removing the object from the one of the optical microscope and the particle beam microscope and imaging it with the other of the optical microscope and the particle beam microscope.

2. The method according to claim 1, further comprising inserting the slide first into the optical microscope and then into the particle beam microscope;

placing an object on the slide and covering the object with the cover glass and the transparent film, applying an immersion fluid onto the transparent film prior to imaging with the optical microscope, and removing the immersion fluid by lifting off the transparent film after imaging with the optical microscope to avoid immersion fluid contaminating the particle beam microscope.

3. The method according to claim 1, further comprising utilizing the transparent film with a stiffening ring at a periphery thereof.

4. The system according to claim 1, further comprising adhering the transparent film to the cover glass with an adhesive layer on one side of the transparent film, wherein the adhesive layer remains adherent exclusively to the transparent film when the transparent film is lifted off the cover glass.

5. The system according to claim 1, further comprising selecting the second refractive index of the transparent film to differ from the first refractive index of the cover glass by at most ten percent.

6. The system according to claim 1, further comprising selecting the transparent film to be larger than the cover glass.

* * * * *

UNITED STATES PATENT AND TRADEMARK OFFICE
CERTIFICATE OF CORRECTION

PATENT NO. : 10,473,907 B2
APPLICATION NO. : 15/429885
DATED : November 12, 2019
INVENTOR(S) : Christian Thomas et al.

It is certified that error appears in the above-identified patent and that said Letters Patent is hereby corrected as shown below:

On the Title Page

Item (72), Inventors: delete "Heldenhelm an der Brenz" and insert --Heidenheim an der Brenz--

Signed and Sealed this
Thirty-first Day of March, 2020

Andrei Iancu
*Director of the United States Patent and Trademark Office*